United States Patent
Chou et al.

(10) Patent No.: US 7,191,820 B2
(45) Date of Patent: Mar. 20, 2007

(54) PHASE-CHANGE HEAT RESERVOIR DEVICE FOR TRANSIENT THERMAL MANAGEMENT

(75) Inventors: Der Jeou Chou, Mesa, Maricopa County, AZ (US); Daniel Todd Nelson, Cave Creek, AZ (US)

(73) Assignee: Enertron, Inc., Chandler, AZ (US)

( * ) Notice: Subject to any disclaimer, the term of this patent is extended or adjusted under 35 U.S.C. 154(b) by 0 days.

(21) Appl. No.: 11/354,473

(22) Filed: Feb. 14, 2006

(65) Prior Publication Data
US 2006/0151146 A1    Jul. 13, 2006

Related U.S. Application Data

(62) Division of application No. 10/055,434, filed on Jan. 23, 2002, now Pat. No. 6,997,241.

(60) Provisional application No. 60/264,551, filed on Jan. 26, 2001.

(51) Int. Cl.
*F28D 15/00* (2006.01)
*F28D 19/00* (2006.01)

(52) U.S. Cl. .................. 165/10; 165/80.3; 165/104.33

(58) Field of Classification Search ............... 165/80.3, 165/10, 104.33
See application file for complete search history.

(56) References Cited

U.S. PATENT DOCUMENTS

| | | | |
|---|---|---|---|
| 4,131,158 A | 12/1978 | Abhat et al. | |
| 4,285,027 A | 8/1981 | Mori et al. | |
| 4,498,295 A | 2/1985 | Knoos | |
| 4,976,308 A | 12/1990 | Faghri | |
| 5,000,252 A | 3/1991 | Faghri | |
| 5,057,968 A | 10/1991 | Morrison | |
| 5,509,468 A | 4/1996 | Lopez | |
| 5,596,228 A | 1/1997 | Anderton et al. | |
| 5,905,636 A | 5/1999 | Baska et al. | |
| 6,055,154 A | 4/2000 | Azar | |
| 6,085,831 A | 7/2000 | DiGiacomo et al. | |
| 6,120,530 A | 9/2000 | Nuckols et al. | |
| 6,157,538 A | 12/2000 | Ali et al. | |
| 6,166,907 A | 12/2000 | Chien | |
| 6,220,337 B1 | 4/2001 | Chen et al. | |
| 6,234,240 B1 | 5/2001 | Cheon | |
| 6,297,090 B1 | 10/2001 | Kim | |
| 6,631,755 B1 | 10/2003 | Kung et al. | |

FOREIGN PATENT DOCUMENTS

EP        1113495 A2    12/2000

*Primary Examiner*—A. Michael Chambers
(74) *Attorney, Agent, or Firm*—Robert D. Atkins; Quarles & Brady LLP (57) ABSTRACT

A heat transfer system is presented for managing thermal transients, thus providing engineers greater flexibility in designing thermal solutions for applications subject to transient heat-generation. A heat reservoir device for managing a heat input subject to transient conditions includes a heat transfer subsystem having a first end and a second end, where the first end is thermally coupled to the heat input; a heat storage subsystem coupled to the second end of the heat transfer subsystem, where the heat storage subsystem comprises a phase change material responsive to the transient conditions. The excess heat load during transient operation is temporarily absorbed by the latent heat of fusion when the phase change material changes its phase from solid to liquid. Subsequently, the absorbed heat can be released back to the ambient via a heat rejection subsystem. This allows engineers to design smaller heat sinks capable of accommodating given transient conditions. This results in heat sinks which are lower cost and smaller size, or which reduce the requirement to provide higher airflow, thereby also decreasing cost and noise, and increasing reliability.

21 Claims, 9 Drawing Sheets

PHASE-CHANGE HEAT RESERVOIR DEVICE FOR TRANSIENT THERMAL MANAGEMENT

CLAIM TO DOMESTIC PRIORITY

The present application is a divisional patent application of application Ser. No. 10/055,434, Jan. 23, 2002 now U.S. Pat. No. 6,997,241, which claims priority to U.S. Provisional Application 60/264,551, filed Jan. 26, 2001, which applications are incorporated herein by reference.

BACKGROUND OF THE INVENTION

1. Technical Field

The present invention relates, generally, to heat transfer systems and, more particularly, to a method of managing thermal transients through the use of phase-change heat reservoirs.

2. Background Information

Recent advances in the design and fabrication of electronic components has dramatically increased their speed and density but has, at the same time, led to significant challenges for thermal engineers seeking to provide heat-transfer solutions for such components. These heat transfer challenges are particularly severe in applications subject to transient heat generation.

Currently known methods of addressing transient heat generation are undesirable in a number of respects. For example, when confronted by thermal requirements of a system, thermal engineers will typically select the maximum heat load in the transient heat profile as the guideline for designing the thermal solution. This "worst-case-scenario" practice invariably results in an unnecessarily large heat sink or cooler that is not used to its full capacity during normal operation.

Furthermore, if there is a space constraint for the overall system which does not allow the full required space for a traditional thermal solution, then the engineer must increase the cooling airflow (through the use of fans or other forced convection devices) and/or use other means to improve performance. This can result in increased noise and other undesirable effects.

While the prior art makes limited use of phase change materials to store transient thermal energy, such solutions effectively utilize large heat-sinks having an integral phase-change chamber which is simply attached to the heat source. This solution fails to address, among other things, the space constraints presented by modem systems.

Methods are therefore needed in order to overcome these and other limitations of the prior art.

BRIEF SUMMARY OF THE INVENTION

Systems and methods in accordance with the present invention overcome the prior art by providing a heat transfer system capable of managing thermal transients, thus giving engineers greater flexibility in designing thermal solutions for applications subject to transient heat-generation. In accordance with one embodiment of the present invention, a heat reservoir device for managing a heat input subject to transient conditions comprises: a heat transfer subsystem configured to distribute heat from a heat input to a heat storage subsystem, said heat storage subsystem comprising a phase change material responsive to said transient conditions.

In accordance with one aspect of the present invention, the excess heat load during transient operation is temporarily absorbed by the latent heat of fusion when the phase change material changes its phase from solid to liquid. Subsequently, the absorbed heat can be released back to the ambient via a heat rejection subsystem.

In accordance with another aspect of the present invention, methods are provided for designing smaller heat sinks capable of accommodating given transient conditions. This results in heat sinks which are lower cost and smaller size, or which reduce the requirement to provide higher airflow, thereby also decreasing cost and noise, and increasing reliability.

BRIEF DESCRIPTION OF THE SEVERAL VIEWS OF THE DRAWINGS

The subject invention will hereinafter be described in conjunction with the appended drawing figures, wherein like numerals denote like elements, and.

DETAILED DESCRIPTION OF EXEMPLARY EMBODIMENTS

Systems and methods in accordance with the present invention overcome the prior art by providing a heat transfer system capable of managing thermal transients through the use of a phase change heat reservoir device.

Overview

Figure 1:
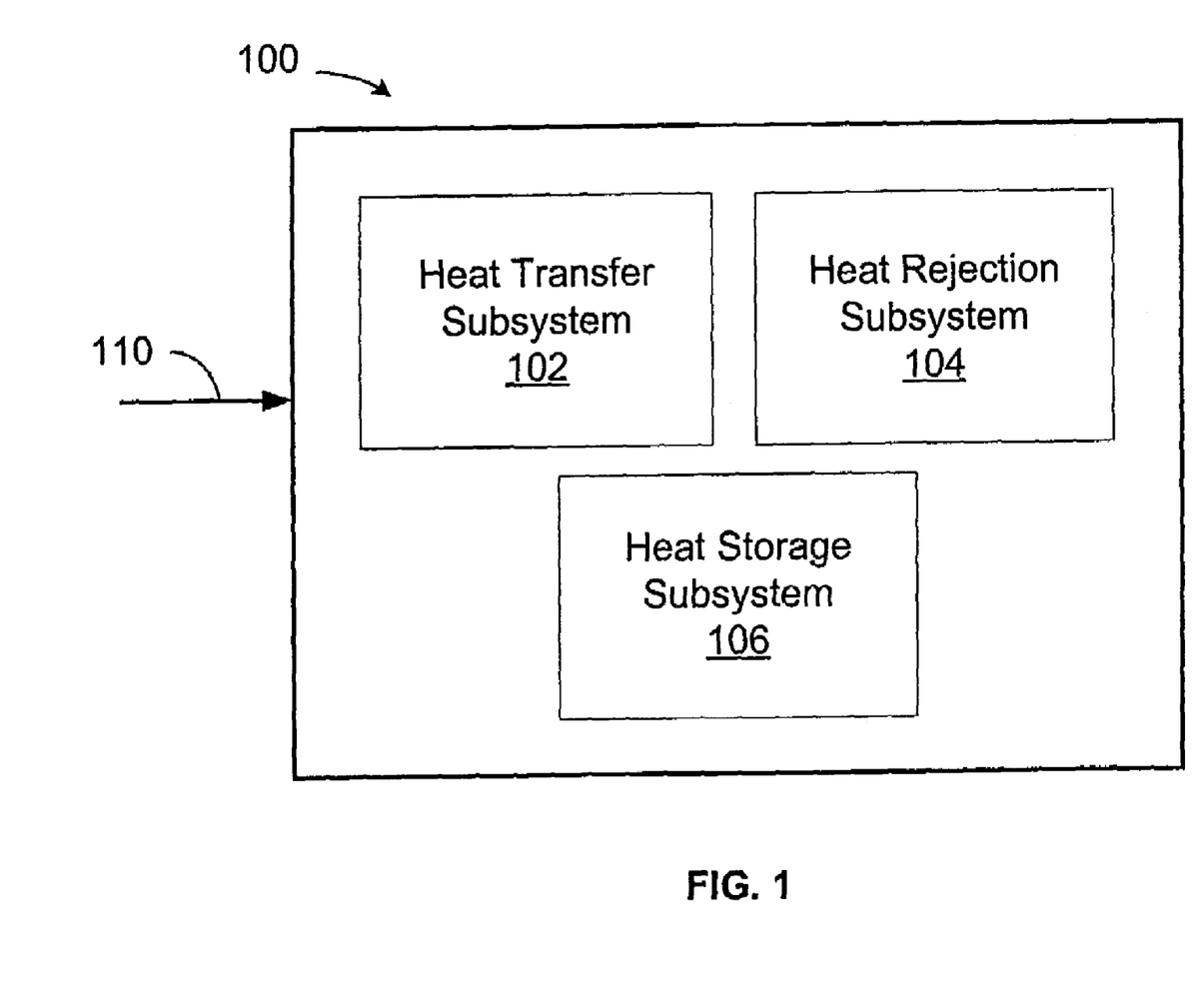
FIG. 1 is a schematic overview of a heat transfer system in accordance with one aspect of the present invention.

Referring now to FIG. 1, a system 100 in accordance with the present invention generally includes a heat transfer subsystem 102, a heat rejection subsystem 104, and a heat storage subsystem 106, wherein system 100 accepts a heat input 110 subject to transient conditions. Heat storage subsystem 106 is configured to absorb excess thermal load generated during these transient conditions, and heat rejection subsystem 104 is configured to transfer the heat away from system 100 (i.e., to the ambient environment). Heat transfer subsystem 102 then provides the thermal path between the various subsystems 106 and 104 and heat input 110. As will be discussed in detail below, these three subsystems may comprise a variety of components, and may be arranged in a variety of topologies. Furthermore, certain subsystems (e.g., heat rejection subsystem 104), may not be required in particular applications. As described in detail below, the combination of heat transfer subsystem 102 and heat storage subsystem 106 is often collectively referred to herein as a "heat reservoir".

Heat transfer subsystem 102 provides one or more thermal paths from input 110 to and between subsystems 102, 104, and 106. Toward this end, heat transfer subsystem may comprise any suitable heat transfer component or components. For example, heat transfer subsystem 102 may include a conductive material, heat-pipe, thermosyphon, liquid cooling loop, or the like, connected to a heat collector which itself contacts or is otherwise thermally coupled to the heat source. Various embodiments such as these will be discussed below in connection with FIGS. 2–9.

Heat rejection subsystem 104 provides the primary heat path to the external environment, and may operate through one or more heat transfer modes, i.e., convection (forced or free), radiation, and/or conduction. For example, heat rejection subsystem 104 may include one or more heat sinks, radiators, coldplates, or the like. Heat storage subsystem 106 acts as a thermal storage unit, or "heat capacitor," and, in conjunction subsystems 102 and 104, provides relief from thermal transients presented by input 110. In a preferred embodiment, heat storage subsystem comprises a phase-change heat reservoir device.

The term "thermal transients" as applied to input 110 refers to a substantial change in heat generation which in traditional heat transfer systems would lead to a concomitant increase in component surface temperature. In general, transient heat transfer is heat transfer that does not reach steady state, or which has multiple steady states. For example, in the case of large semiconductor microprocessors, it is not unusual for the maximum thermal load to exceed normal operating load by about 30%. Such thermal transients are experienced by a number of components in a variety of applications, including, for example, semiconductor devices, optoelectronic devices, thermoelectric coolers, and the like. Those skilled in the art will appreciate, however, that the present invention is not so limited, and that the systems and methods presented herein can be used in any application subject to transient thermal conditions.

EXEMPLARY EMBODIMENTS

Having thus given an overview of the present invention, a number of exemplary embodiments will now be described. It will be appreciated, however, that the illustrated embodiments constitute merely a small subset of possible configurations, and that the invention is not so limited.

Figure 2:
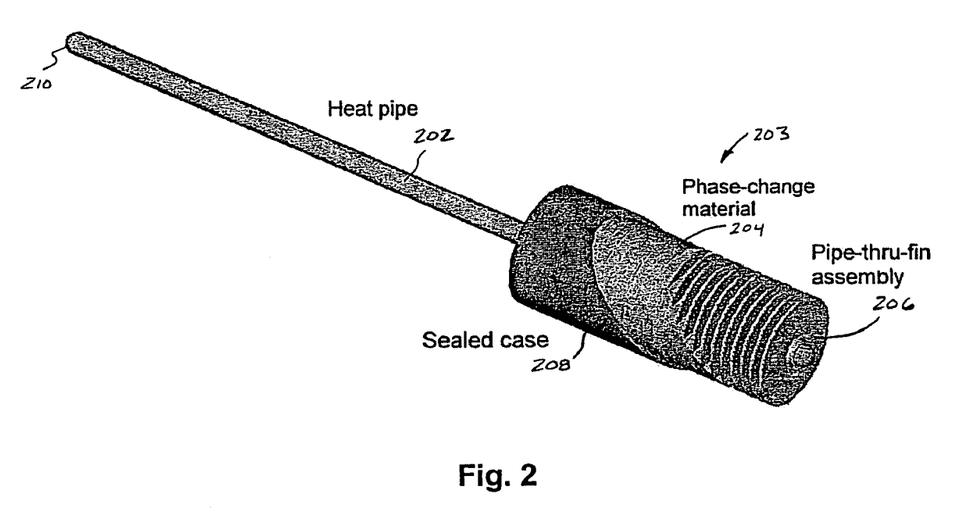
FIG. 2 is a partial cut-away view of a heat reservoir in accordance with one embodiment of the present invention.

Referring first to FIG. 2, a heat reservoir in accordance with one aspect of the present invention includes a heat transfer subsystem 202 thermally coupled to heat storage subsystem 203. Without loss of generality, the illustrated embodiment is shown as a heat pipe 202 thermally coupled to a phase-change heat storage subsystem 203, wherein subsystem 203 includes a sealed case 208, a phase-change material 204, and a plurality of fins 206 having heat pipe 202 extending there-through in what is often termed a "pipe-through-fin" configuration. One end 210 of heat pipe 202 is thermally coupled to the heat source generating the heat input 110 shown in FIG. 1.

As is known in the art, a heat pipe is an efficient heat conductor typically consisting of an elongated vessel having a wick structure lining its inner walls and an enclosed working fluid. When one end of the heat pipe is heated, the working fluid undergoes a phase change and evaporates from liquid to vapor. The vapor travels through the hollow core to the other end of the heat pipe, where heat energy is removed by a heat sink or the like. The vapor condenses back to liquid, releasing heat, and the resulting liquid travels back to the first end through capillary action via the wick. The working fluid of the heat pipe is selected in accordance with the temperature range of the heat source. Common working fluids include, for example, water, methanol, and liquid ammonia. Other working fluids may be selected depending upon the operational range of the heat pipe.

In this regard, it will be appreciated that these and other general principles of heat-transfer, conduction, convection, and radiation will be well understood by those skilled in the art, and will therefore not be described in detail herein. Basic information regarding heat-transfer can be found in a number of references, including, for example, INCROPERA AND DEWITT, FUNDAMENTALS OF HEAT AND MASS TRANSFER, 5th ed. (2001), and HOLMAN, J. P., HEAT TRANSFER, 9th ed. (2002). Additional information regarding the nature of heat pipes may be found, for example, IN G. P. PETERSON, AN INTRODUCTION TO HEAT PIPES: MODELING, TESTING, AND APPLICATIONS (1994).

It will also be appreciated that, as mentioned above, the present invention is not limited to the use of heat pipes. The heat transfer subsystem shown as heat pipe 202 in FIG. 2 may comprise any other suitable heat transfer component, e.g., a closed-loop liquid path, thermosyphon, a high conductivity carbon fiber material, a high conductivity metal, or the like.

Heat storage subsystem 203 employs a phase change material 204, housed within sealed case 208, which changes phases (e.g., from solid to liquid) at a threshold temperature in response to heat input, thereby acting as a heat storage unit or heat capacitor. Phase change material 204 is preferably selected based on, among other things, its fusion or transition temperature. More particularly, in a preferred embodiment, phase change material 204 is selected such that its transition temperature is less than the maximum operating temperature of the heat source being cooled (i.e., the source of heat input 110 in FIG. 1) and greater than the steady state temperature of the heat source at its nominal heat emitting state. Depending upon the application, acceptable phase change materials include, for example, various salt hydrates such as magnesium nitrate, sodium acetate, etc., paraffin, water, methanol, liquid nitrogen, liquid ammonia, and polyalcohols such as pentaglycerine and neopentylglyol.

Sealed case 208 may be configured in any suitable shape and may be fabricated using a variety of materials, e.g., plastics such as polypropelene, EPDM, and polyolefin, and/or metals such as steel, stainless steel, copper, aluminum, and the like.

Fins 206 are thermally coupled to the heat transfer subsystem 202 and are preferably distributed evenly and efficiently within sealed case 208 so as to reduce large open areas. The fins may comprise any suitable material, for example, copper, aluminum, carbon-fiber, etc. In the illustrated embodiment, fins 206 are thin discs suitably bonded to heat pipe 202, which extends axially through a cylindrical sealed case 208. Fins 206 may be bonded to heat pipe 202 through a variety of known techniques, including, for example, direct bond, pressure bond, adhesive bond, epoxy bond, solder bond, brazed bond, interfacing material bond, and the like.

In general, the illustrated system functions as follows. Heat enters the system at end 210 of heat pipe 202 (which may include the use of a heat collector, described in detail below) and traverses heat pipe 202 to heat storage subsystem 203. Under nominal conditions, heat storage subsystem will absorb a portion of the heat entering the system, causing phase change material 203 to raise in temperature slightly, but not reaching the phase changing temperature of phase change material 204 (e.g., the material remains solid).

When the heat load increases and/or the environmental conditions become more severe (e.g., through increased ambient temperature, decreased airflow, etc.) the temperature of all components in the system will increase. When the temperature of the phase change material 204 increases beyond the phase change temperature, the material will begin to melt, and this phase change process consumes extra energy while maintaining the temperature at the phase change temperature. Thus, the heat storage subsystem will be maintained at a temperature slightly higher than the phase change temperature, while the additional heat will be stored in the latent heat of the phase change material 204. Any heat dissipation subsystems (not shown in FIG. 2) will continue to dissipate the heat, but will not be overburdened by the extra heat or more severe environmental conditions.

When the system returns to its nominal heat load, the excess heat stored in storage subsystem 203 will be conducted back through heat pipe 202 and, eventually, dissipated through any heat rejection subsystems present in the system. At this time, the temperature of the system components will remain higher while there is a mixture of solid and liquid phase change material 204 in heat storage subsystem 203. Once all energy stored in the latent heat of phase change material 204 has been dissipated, the system returns to its normal operating temperature.

Particular embodiments of the present invention appropriate for any particular application may be selected in accordance with three key design parameters. First, the amount of heat energy that can be stored by the heat reservoir is dependent upon the volume of phase change material 204 encapsulated within heat storage subsystem 203. Second, the rate of heat transferred to phase change material 204 is dependent upon the geometry of heat pipe 202 and the surface area of fins 206. Third, the phase change temperature is dependent upon the material properties of phase change material 204. Thus, by varying these three parameters, an efficient heat transfer system can be selected for a particular application.

Figure 3:
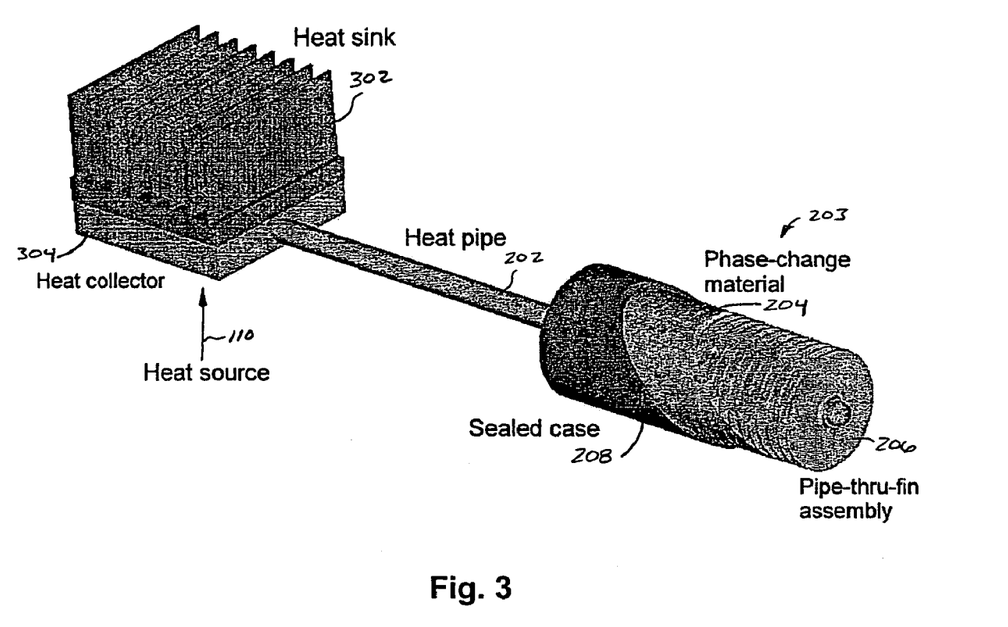
FIG. 3 is a partial cut-away view of a heat reservoir interfacing with a heat collector and heat sink in accordance with one embodiment of the present invention.

FIG. 3 shows an alternate embodiment further comprising a heat collector and heat rejection subsystem. Specifically, a heat collector 304 is thermally coupled to heat source 110, heat sink 302, and heat pipe 202. Heat collector 304 (e.g., a plate in direct contact with the heat source) functions, during nominal conditions, primarily as a method of distributing thermal energy to heat sink 302, where it is dissipated in the conventional manner. At the same time, however, a discrete amount of heat transfer is effected by heat pipe 202 to heat storage subsystem 203. As described above in connection with FIG. 2, after a transient heating event, heat is transferred from heat storage subsystem 203 to heat collector 304 via heat pipe 202, where the extra thermal energy is dissipated (by heat sink 302) and normal operation can proceed. It will be appreciated that, while the illustrated embodiment depicts a finned heat sink 302, and the phrase "heat sink" is used herein for the purposes of simplicity, a variety of other known or future heat-rejection components may be employed, e.g., radiators, cold-plates, peltier coolers, heat exchangers and the like.

Heat collector 304 may comprise any suitable component capable of being thermally coupled to the surrounding components. In the illustrated embodiment, for example, heat collector 304 comprises a block of conductive material (e.g., metal, or a composite material) which can be positioned in direct contact with the heat source 110. This embodiment would be particularly applicable in microelectronic applications, where the heat source 110 typically consists of a rectangular semiconductor chip having an exposed surface, typically a metal lid, bare die, a plastic, or an epoxy. A variety of thermal adhesives, greases, and/or pads (no shown) may be used to further enhance thermal connectivity between heat collector 304 and heat source 110.

Figure 4:
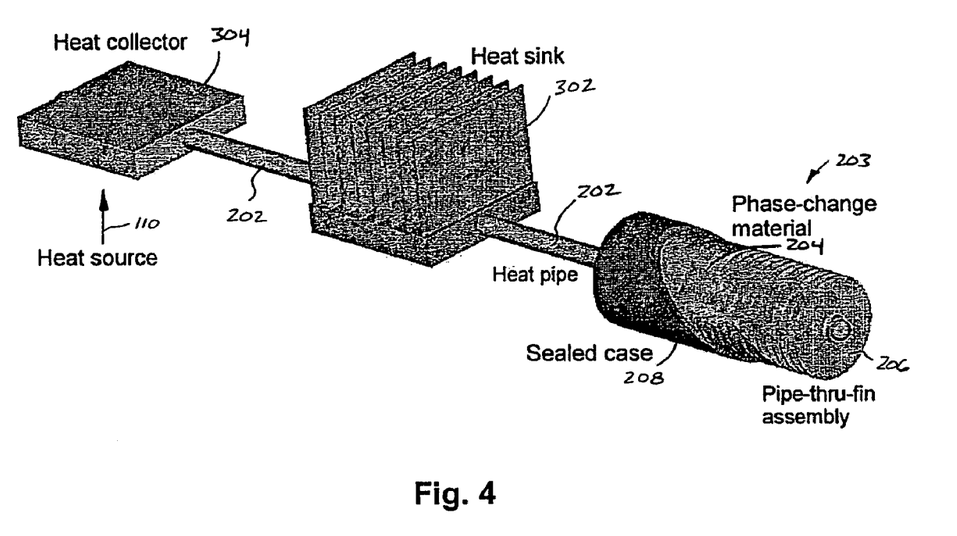
FIG. 4 is a partial cut-away view of one embodiment of the present invention wherein the heat sink and heat reservoir remotely located from the heat collector.

FIG. 4 shows another embodiment of the present invention wherein heat sink 302 is positioned between heat collector 304 and heat storage subsystem 203. Either separate heat pipe segments 202, or a continuous heat pipe 202 are used to provide thermal coupling between heat sink 302 and the two antipodal components (i.e., heat collector 304 and heat storage subsystem 203). Furthermore, additional embodiments may be conceived wherein single or multiple heat pipes may be configured in parallel or serial between one or more of the subsystems.

This configuration offers the further advantage that, for a given height of heat sink 302, the assembly has an overall lower profile; i.e., the vertical distance between the bottom of heat collector 304 and the top of heat sink 302 is reduced by an amount equal to the thickness of heat collector 304.

While the configuration shown in FIG. 4 includes two heat pipe segments 202 of approximately equal length extending from heat sink 302 about 180-degrees apart, the present invention comprehends any other suitable geometry.

Figure 5:
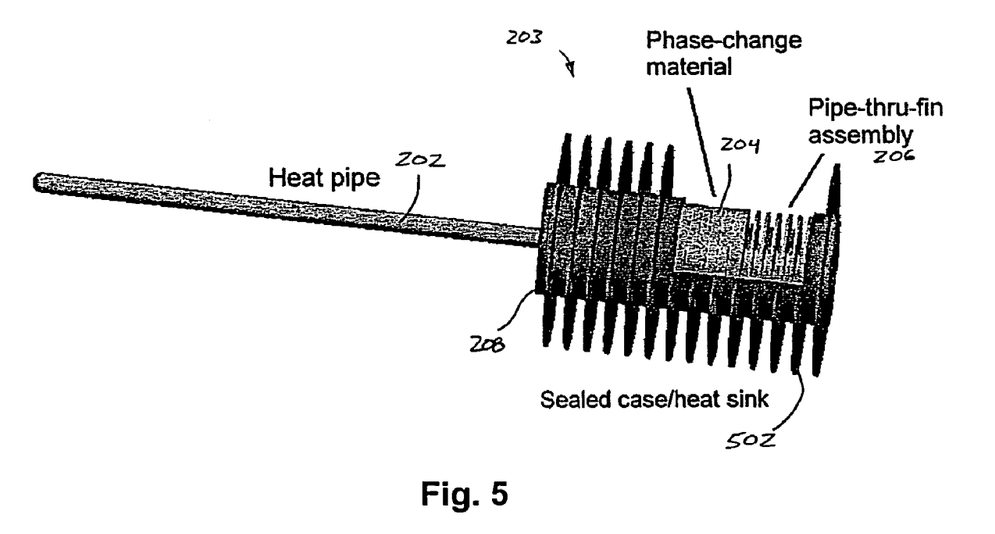
FIG. 5 is a partial cut-away view of an alternate embodiment of the present invention wherein a heat-sink is integrated with the heat reservoir.

FIG. 5 shows another embodiment for a heat reservoir where, as in FIG. 2, the heat pipe 202 is thermally coupled to heat storage subsystem 203, but wherein the heat rejection subsystem 203 is integrated with the heat storage subsystem 203. More particularly, in the illustrated embodiment, a series of fins 502 are directly attached to the sealed case of heat storage subsystem 203. This embodiment may or may not be integrated with a second heat sink, depending upon the particular application; that is, the heat reservoir design shown may be substituted into the configurations shown in FIGS. 3 and 4, if desired.

Figure 6:
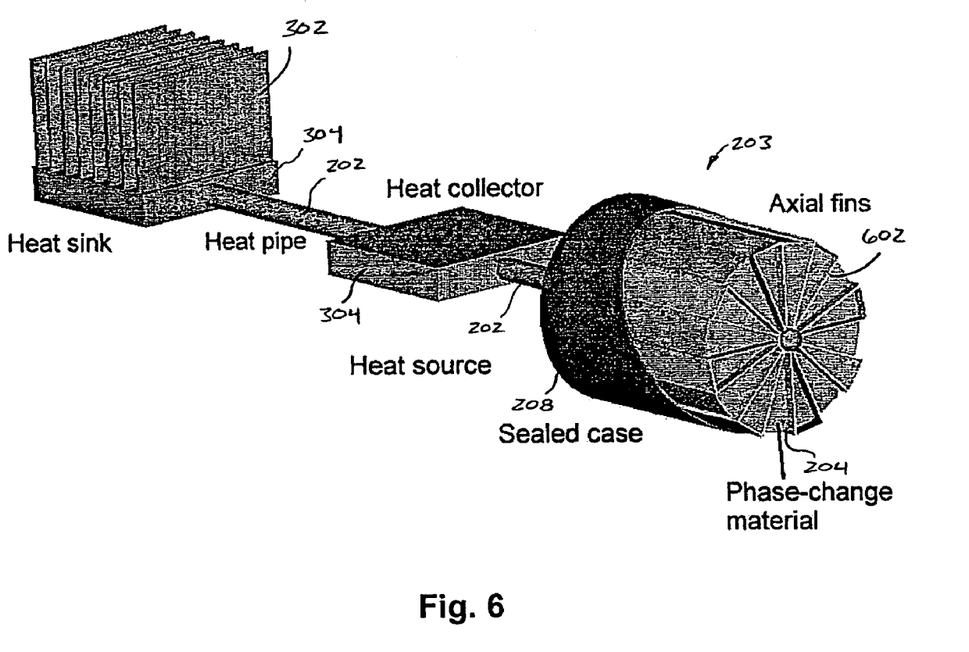
FIG. 6 is a partial cut-away view of an alternate embodiment of the present invention wherein the heat storage subsystem includes axial fins.
Figure 8:
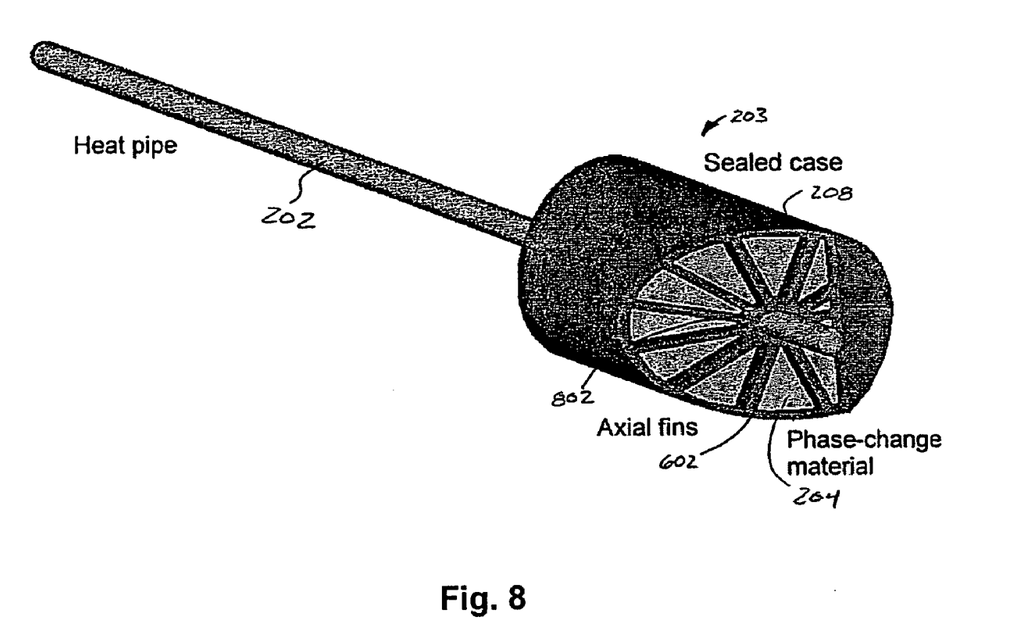
FIG. 8 is a partial cut-away view of a heat reservoir wherein axial fins are separated from the heat transfer medium.

FIG. 6 shows another embodiment which includes a centrally-located heat collector 304 thermally coupled to heat sink 302 via a heat pipe segment 202, and thermally coupled to thermal storage subsystem 203 through a second heat pipe segment 202 or continuous pipe(s) leading from the heat sink. Furthermore, the illustrated embodiment includes a variation in it heat storage system in that a series of axial fins 602 are wrapped around heat pipe 202. FIG. 8 shows another embodiment, a variation of that shown in FIG. 6, wherein axial fins 602 are joined to a thermal base, which is thermally joined to the heat pipe.

Figure 7:
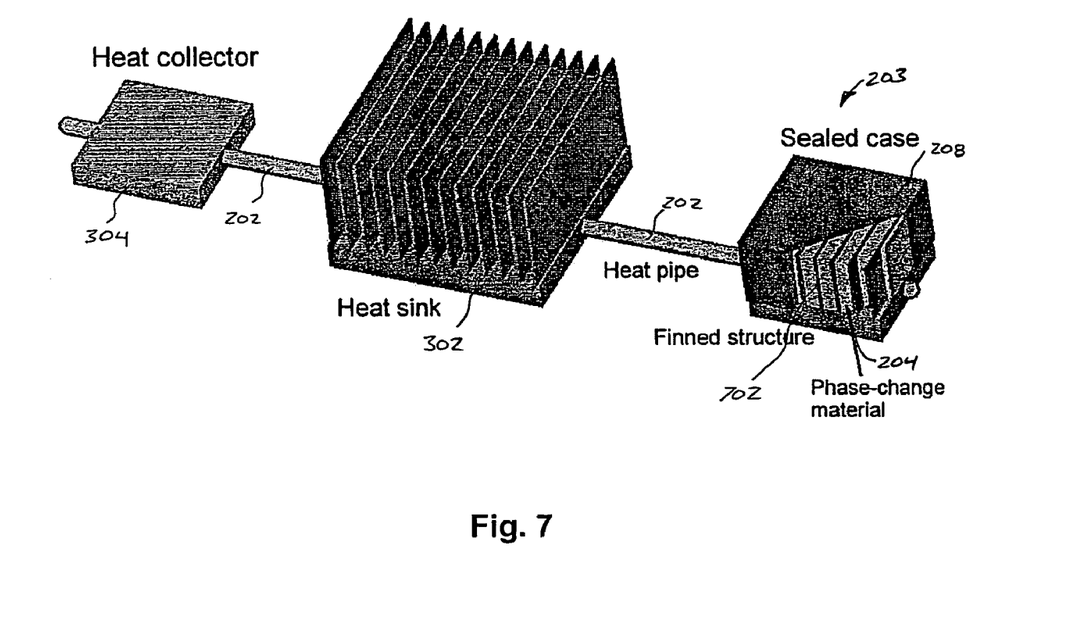
FIG. 7 is a partial cut-away view of an alternate embodiment of the present invention.

FIG. 7 shows another embodiment, wherein heat storage subsystem 203 includes a series of rectilinear fins 702, and wherein heat pipe 202 is mounted to its base. This embodiment is particularly advantageous from a manufacturing point-of-view, as fabrication of the sealed case is independent of the heat pipe or pipes, allowing the case to become a standard item that is easily integrated into a variety of systems.

It is important to note that a wide variety of geometries are possible. As illustrated, the heat is added to the base, and the heat pipe is simply embedded or laid against the base to form a thermal path. The heat pipe does not pass through the phase change material in the heat reservoir as it does in other illustrated embodiments.

Furthermore, it should be noted that there are a large variety of fin structures that are possible and valid, such as rectilinear fins, pin fins, radial fins, and circular fins. While fins generally provide an effective way to conduct the heat throughout the phase change material, in other embodiments the reservoir need not include fins at all.

Figure 9:
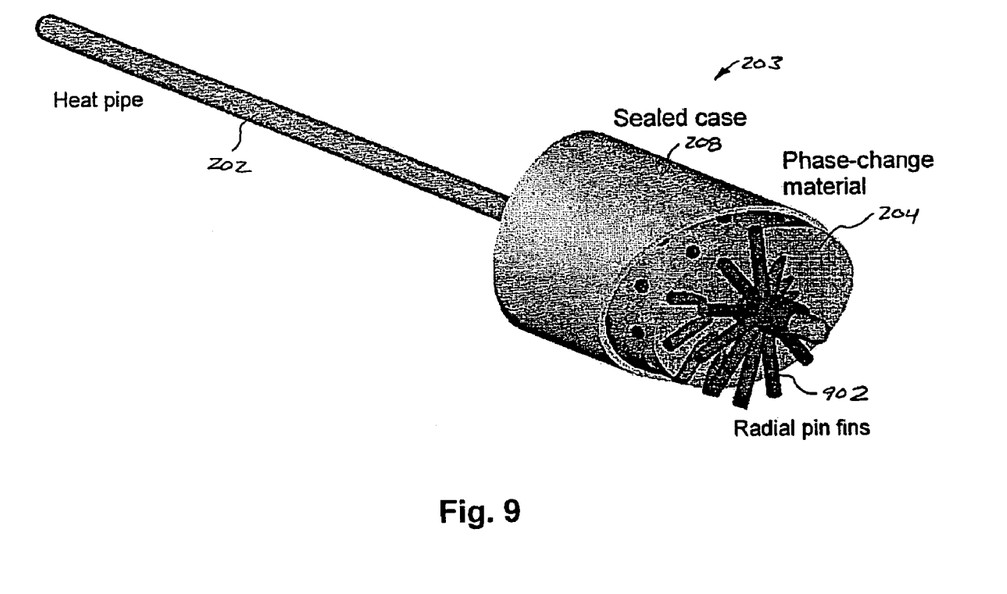
FIG. 9 is a partial cut-away view of a heat reservoir comprising radial pin fins.

FIG. 9 shows yet another embodiment, wherein heat storage subsystem 203 includes a series of radial pin fins 204 distributed in a suitable pattern around a heat pipe 202, and which may or may not directly contact heat pipe 202, as described above in connection with FIGS. 6 and 8.

SUMMARY

What has been presented is a heat transfer system capable of managing thermal transients. As described above, it is possible to design particular configurations of the present invention depending upon, among other things, space limitations and thermal conditions.

Embodiments of the present invention are particularly advantageous in the following sets of conditions:
1. Transient heat load with high peak/base load ratio, short duration peak load, wherein limited space prohibits full peak load heat sink or radiator plate.
2. Transient environment and limited space prohibits full peak load heat sink, or radiator plate.
3. Short duration heat load and no available convection airflow.
4. Short duration heat load and no space available for heat sink.
5. Low profile heat reservoir.
6. Overheating protection for short duration.
7. General Temperature stabilization.

One or more of the above conditions may be present in a variety of current and future applications, including, for example, TEC driven car seat air conditioning, radiation detector heat loads, missile components, satellite components, lab/medical/scientific instruments, future generations of palm-tops and cell phones, telecom CPU fault protection, no-fault computers, instruments, controllers, systems designed to prolong shut-down time period or enable sufficient time to start-up back-up systems, and telecom (and/or electronics) enclosures requiring temperature-stabilization under extreme transient high-ambient temperature conditions.

Other examples where the present invention may be particularly advantageous include such items as laptop computers, mobile electronics, personal data assistants and cell phones, thermoelectrically driven coolers, short-life components, telecom applications, electronic video game consoles, and the like, where it is necessary to accommodate dramatic transient loads from a heat source such as a semiconductor or integrated optic device.

As mentioned in the Background section, the traditional heat transfer solution for the above applications would involve selecting a very large heat sink designed to dissipate the maximum thermal transient generated by the target component. If there was insufficient space available to accommodate the design, then additional cooling would need to be provided through the use of increased air flow or other means.

In contrast, systems in accordance with the present invention would allow the engineer to incorporate a much smaller heat sink or use lower airflow or lower coolant flow, or reside in a higher ambient designed to accommodate normal heating conditions while at the same time incorporating a relatively small heat storage subsystem capable of absorbing transient heat input.

Although the invention has been described herein in conjunction with the appended drawings, those skilled in the art will appreciate that the scope of the invention is not so limited. For example, while the various embodiments have been discussed occasionally in the context of semiconductor applications and electronic components, it will be appreciated that the invention may be employed in any application where the reduction of thermal transients aids the engineer in designing a heat-transfer solution. Furthermore, it will be apparent that a heat storage subsystem may be implemented using a wide variety of fin designs and geometries. The figures depict merely a few possible designs. These and other modifications in the selection, design, and arrangement of the various components and steps discussed herein may be made without departing from the scope of the invention as set forth in the appended claims.

What is claimed is:

1. A method of manufacturing a heat reservoir device for managing a heat input from a component subject to transient conditions and having space constraints defined by a first volume of available space surrounding the component, the heat reservoir device comprising:
   providing a heat transfer subsystem comprising a heat transfer component incorporating a thermosiphon loop, a solid or substantially solid, high-conductivity material, or a closed liquid loop path, the heat transfer subsystem having a first end thermally coupled to the component and a second end thermally coupled to a heat storage subsystem;
   providing a heat collector thermally coupled to the heat transfer subsystem and the heat input, the heat conductor having a block of conductive material positioned in direct contact with a heat source; and
   providing a heat rejection subsystem coupled to the heat storage subsystem, wherein:
      the heat storage subsystem is remotely situated from the heat input, outside the first volume of available space, and comprises a phase change material capable of changing phases in response to the transient conditions causing the temperature of the phase change material to rise above its phase change temperature, the phase change material selected such that its transition temperature is less than the maximum operating temperature of the heat input and greater than the steady state temperature of the heat input at its nominal heat emitting state, and
      the heat rejection subsystem and the heat storage system have a combined volume that is greater than the first volume of available space.

2. The method of manufacturing the heat reservoir device of claim 1, wherein the high-conductivity material further includes high-conductivity carbon fiber material or high-conductivity metal material.

3. The method of manufacturing the heat reservoir device of claim 1, wherein the heat collector incorporates a thermal adhesive, grease, or pad to enhance thermal connectivity between the heat collector and the heat source.

4. The method of manufacturing the heat reservoir device of claim 1, wherein:
   the heat storage subsystem further includes a sealed case and a plurality of tins thermally coupled to the heat transfer subsystem and encapsulated by the sealed case, the phase change material is thermally coupled to the plurality of fins, and the plurality of fins are selected from the group consisting of radial pin fins, rectilinear fins, and disc-shaped fins.

5. A heat reservoir device for managing a heat input from a component subject to transient conditions and having space constraints defined by a first volume of available space surrounding the component, the heat reservoir device comprising:

a heat transfer subsystem comprising a thermosiphon loop having a first end thermally coupled to the component and a second end thermally coupled to a heat storage subsystem; and a heat rejection subsystem coupled to the heat storage subsystem, wherein:

the heat storage subsystem is remotely situated from the heat input, outside the first volume of available space, and comprises a phase change material capable of changing phases in response to the transient conditions causing the temperature of the phase change material to rise above its phase change temperature, and the heat rejection subsystem and the heat storage system have a combined volume that is greater than the first volume of available space.

6. The heat reservoir device of claim 5, further including a heat collector thermally coupled to the heat transfer subsystem and the heat input.

7. The heat reservoir device of claim 5, wherein:

the heat storage subsystem further includes a sealed case and a plurality of fins thermally coupled to the heat transfer subsystem and encapsulated by the sealed case, the phase change material is thermally coupled to the plurality of fins, and the plurality of fins are selected from the group consisting of radial pin fins, rectilinear fins, and disc-shaped fins.

8. The heat reservoir device of claim 5, wherein the phase change material is selected such that its transition temperature is less than the maximum operating temperature of the heat input and greater than the steady state temperature of the heat input at its nominal heat emitting state.

9. The heat reservoir device of claim 5, wherein the component is contained within a housing, wherein the housing is capable of accommodating a heat-sink of predetermined dimensions.

10. The heat reservoir device of claim 9, wherein the heat sink is configured to dissipate heat at the maximum operating temperature of the heat input.

11. The heat reservoir device of claim 5, wherein the component is contained within a housing, wherein the component within the housing experiences a predetermined airflow.

12. The heat reservoir device of claim 5, wherein the component is contained within a housing, wherein the housing experiences a predetermined ambient temperature.

13. A heat reservoir device for managing a heat input from a component subject to transient conditions and having space constraints defined by a first volume of available space surrounding the component, the heat reservoir device comprising:

a heat transfer subsystem comprising a heat transfer component incorporating a solid or substantially solid, high-conductivity material, the heat transfer subsystem having a first end thermally coupled to the component and a second end thermally coupled to a heat storage subsystem;

a heat collector thermally coupled to the heat transfer subsystem and the heat input, the heat conductor having a block of conductive material positioned in direct contact with a heat source; and a heat rejection subsystem coupled to the heat storage subsystem, wherein:

the heat storage subsystem is remotely situated from the heat input, outside the first volume of available space, and comprises a phase change material capable of changing phases in response to the transient conditions causing the temperature of the phase change material to rise above its phase change temperature, the phase change material selected such that its transition temperature is less than the maximum operating temperature of the heat input and greater than the steady state temperature of the heat input at its nominal heat emitting state, and the heat rejection subsystem and the heat storage system have a combined volume that is greater than the first volume of available space.

14. The heat reservoir device of claim 13, wherein the high-conductivity material further includes high-conductivity carbon fiber material or high-conductivity metal material.

15. The heat reservoir device of claim 13, wherein the heat collector incorporates a thermal adhesive, grease, or pad to enhance thermal connectivity between the heat collector and the heat source.

16. The heat reservoir device of claim 13, wherein:

the heat storage subsystem further includes a sealed case and a plurality of fins thermally coupled to the heat transfer subsystem and encapsulated by the sealed case, the phase change material is thermally coupled to the plurality of fins, and the plurality of fins are selected from the group consisting of radial pin fins, rectilinear fins, and disc-shaped fins.

17. The heat reservoir device of claim 13, wherein the component is contained within a housing, wherein the housing is capable of accommodating a heat-sink of predetermined dimensions.

18. The heat reservoir device of claim 13, wherein the heat collector incorporates a thermal adhesive, grease, or pad to enhance thermal connectivity between the heat collector and the heat source.

19. The heat reservoir device of claim 13, wherein:

the heat storage subsystem further includes a seated case and a plurality of fins thermally coupled to the heat transfer subsystem and encapsulated by the sealed case, the phase change material is thermally coupled to the plurality of fins, and the plurality of fins are selected from the group consisting of radial pin fins, rectilinear fins, and disc-shaped fins.

20. The heat reservoir device of claim 13, wherein the component is contained within a housing, wherein the housing is capable of accommodating a heat-sink of predetermined dimensions.

21. A heat reservoir device for managing a heat input from a component subject to transient conditions and having space constraints defined by a first volume of available space surrounding the component, the heat reservoir device comprising:

a heat transfer subsystem comprising a closed loop liquid path, the heat transfer subsystem having a first end thermally coupled to the component and a second end thermally coupled to a heat storage subsystem;

a heat collector thermally coupled to the heat transfer subsystem and the heat input, the heat conductor having a block of conductive material positioned in direct contact with a heat source; and a heat rejection subsystem coupled to the heat storage subsystem, wherein:

the heat storage subsystem is remotely situated from the heat input, outside the first volume of available space, and comprises phase change material capable of changing phases in response to the transient conditions causing the temperature of the phase change material to rise above its phase change temperature, the phase change material selected such that its transition temperature is less than the maximum operating temperature of the heat input and greater than the steady state temperature of the heat input at its nominal heat emitting state, and the heat rejection subsystem and the heat storage system have a combined volume that is greater than the first volume of available space.

* * * * *

UNITED STATES PATENT AND TRADEMARK OFFICE
CERTIFICATE OF CORRECTION

| | | |
|---|---|---|
| PATENT NO. | : 7,191,820 B2 | Page 1 of 1 |
| APPLICATION NO. | : 11/354473 | |
| DATED | : March 20, 2007 | |
| INVENTOR(S) | : Der Jeou Chou et al. | |

It is certified that error appears in the above-identified patent and that said Letters Patent is hereby corrected as shown below:

Column 8, line 66, delete the word "tins" and replace with -- fins --.

Column 10, line 46, delete the word "seated" and replace with -- sealed --.

Signed and Sealed this

Eighth Day of May, 2007

JON W. DUDAS
*Director of the United States Patent and Trademark Office*